United States Patent
Inatomi

(10) Patent No.: US 8,411,246 B2
(45) Date of Patent: Apr. 2, 2013

(54) RESIST COATING AND DEVELOPING APPARATUS AND METHOD

(75) Inventor: Yuichiro Inatomi, Nirasaki (JP)

(73) Assignee: Tokyo Electron Limited, Minato-Ku (JP)

(*) Notice: Subject to any disclaimer, the term of this patent is extended or adjusted under 35 U.S.C. 154(b) by 215 days.

(21) Appl. No.: 12/878,395

(22) Filed: Sep. 9, 2010

(65) Prior Publication Data

US 2011/0065052 A1 Mar. 17, 2011

(30) Foreign Application Priority Data

Sep. 14, 2009 (JP) ................................. 2009-211818

(51) Int. Cl.
- *G03B 27/32* (2006.01)
- *G03B 27/52* (2006.01)
- *B05C 11/00* (2006.01)

(52) U.S. Cl. ................ 355/27; 355/30; 355/67; 118/63; 118/301

(58) Field of Classification Search .................... 355/27, 355/30, 67; 118/63, 301
See application file for complete search history.

(56) References Cited

U.S. PATENT DOCUMENTS

| | | | |
|---|---|---|---|
| 7,670,960 B2 | 3/2010 | Asou et al. | |
| 7,819,076 B2* | 10/2010 | Inatomi | 118/63 |
| 8,033,244 B2 | 10/2011 | Minamida et al. | |
| 2004/0060582 A1 | 4/2004 | Sasaki et al. | |
| 2009/0152238 A1 | 6/2009 | Inatomi | |
| 2010/0020297 A1* | 1/2010 | Inatomi | 355/30 |
| 2010/0261122 A1* | 10/2010 | Inatomi | 430/325 |
| 2010/0266969 A1* | 10/2010 | Shiraishi et al. | 430/325 |

FOREIGN PATENT DOCUMENTS

| | | |
|---|---|---|
| JP | 05-121308 A1 | 5/1993 |
| JP | 2002-035668 A1 | 2/2002 |
| JP | 2003-234341 A1 | 8/2003 |
| JP | 2004-165614 A1 | 6/2004 |
| JP | 2004-288766 A1 | 10/2004 |
| JP | 2005-019969 A1 | 1/2005 |
| JP | 2005-252100 A1 | 9/2005 |
| JP | 2007-235027 A1 | 9/2007 |
| JP | 2007-266333 A1 | 10/2007 |
| JP | 2009-147198 A1 | 7/2009 |
| JP | 2009-147261 A1 | 7/2009 |

* cited by examiner

*Primary Examiner* — Amanda C. Walke
(74) *Attorney, Agent, or Firm* — Burr & Brown

(57) ABSTRACT

A resist coating/developing apparatus includes: a resist film-forming unit configured to apply a resist onto a substrate to form thereon a resist film; a resist developing unit configured to develop the resist film after exposure to pattern the resist film; a solvent gas generator configured to generate a solvent gas containing a vapor of a solvent having a property of dissolving the resist film; a solvent gas conditioner connected to the solvent gas generator and configured to condition the solvent gas generated in the solvent gas generator; a processing chamber configured to house the substrate having thereon the resist film which has been developed and patterned in the resist developing unit, and connected to the solvent gas conditioner so that the solvent gas, which has been conditioned in the solvent gas conditioning section, is supplied to the substrate housed in the processing chamber; and an exhaust system connected to the processing chamber to evacuate the processing chamber to a reduced pressure.

8 Claims, 9 Drawing Sheets

RESIST COATING AND DEVELOPING APPARATUS AND METHOD

BACKGROUND OF THE INVENTION

1. Field of the Invention

The present invention relates to a resist coating and developing (hereinafter abbreviated as "coating/developing") apparatus and method for coating a substrate with a resist film, and developing the resist film after exposure to form a resist pattern, and more particularly to a resist coating/developing apparatus and method which, by flattening the resist pattern, can reduce the line width roughness of the resist pattern.

2. Description of Related Art

In order to manufacture semiconductor integrated circuits with higher levels of integration, there is a demand for the production of finer circuit patterns. For example, the critical dimension of (CD) of an etching mask is reaching 32 nm or even 22 nm, which values are lower than the resolution limits of existing exposure apparatuses. In the formation of the channel of a field-effect transistor (FET), having such a width, a large line width roughness (LWR) of resist pattern will lead to variation in the threshold voltage of the FET, causing problems such as worsening of properties or abnormal operation of the resulting integrated circuit.

To address such problems, Japanese Patent Laid-Open Publication No. 2005-19969 (JP2005-019969A) describes a method for flattening surface irregularities of a resist film uniform by supplying a solvent gas to a resist film to dissolve the surface of the resist film.

When supplying a solvent gas to a resist film in a resist coating/developing apparatus, it is possible that the solvent gas may diffuse in the resist coating/developing apparatus and a resist film before development may be exposed to the solvent gas. In the case where the resist film is formed of a chemically-amplified resist, an acidic component in the resist film can be neutralized by an alkaline component contained in the solvent, which may inhibit development of the resist film and can even make patterning of the resist film impossible.

Some solvents have a strong pungent odor. If a gas of such a solvent leaks from a resist coating/developing apparatus into the surrounding space, the diffused gas will give an unpleasant feeling to an operator of the apparatus.

SUMMARY OF THE INVENTION

The present invention provides a resist coating/developing apparatus and a resist coating/developing method, which can effectively reduce the line width roughness of a resist pattern while preventing a solvent gas from diffusing outside.

According to a first aspect of the present invention, there is provided a resist coating/developing apparatus comprising: a resist film-forming unit configured to apply a resist onto a substrate to form thereon a resist film; a resist developing unit configured to develop the resist film after exposure to pattern the resist film; a solvent gas generator configured to generate a solvent gas containing a vapor of a solvent having a property of dissolving the resist film; a solvent gas conditioner connected to the solvent gas generator and configured to condition the solvent gas generated in the solvent gas generator; a processing chamber configured to house the substrate having thereon the resist film which has been developed and patterned in the resist developing unit, and connected to the solvent gas conditioner so that the solvent gas, which has been conditioned in the solvent gas conditioner, is supplied to the substrate housed in the processing chamber; and an exhaust system connected to the processing chamber to evacuate the processing chamber to a reduced pressure.

According to a second aspect of the present invention, there is provided a resist coating/developing method comprising: applying a resist onto a substrate to form a resist film; exposing the resist film using a photomask; developing and patterning the exposed resist film; housing the substrate having the patterned resist film in a processing chamber; evacuating the processing chamber to a reduced internal pressure; generating a solvent gas containing a vapor of a solvent having a property of dissolving the resist film; conditioning the solvent gas; and supplying the conditioned solvent gas to the substrate housed in the processing chamber.

The embodiments of the resist coating/developing apparatus and method according to the present invention can effectively reduce the line width roughness of a resist pattern while avoiding contamination of the process atmosphere.

DETAILED DESCRIPTION OF THE INVENTION

Figure 1:
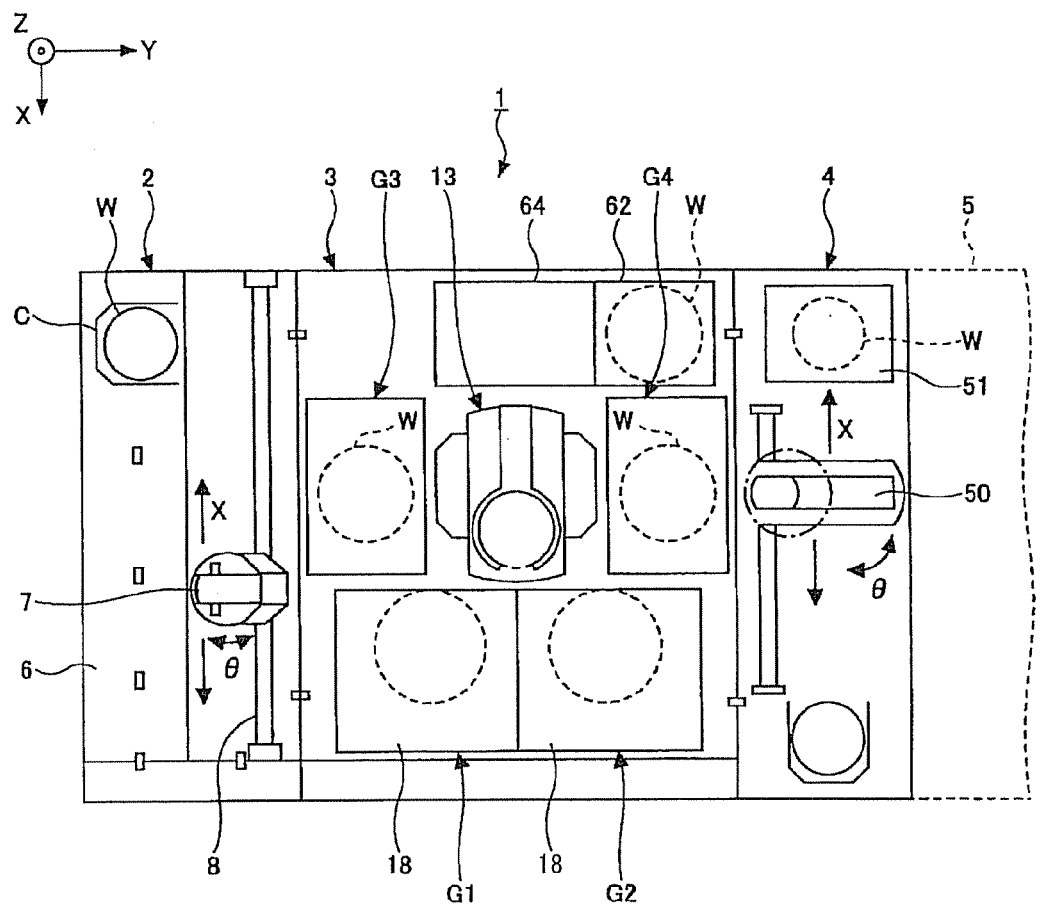
FIG. 1 is a schematic plan view showing the construction of a resist coating/developing apparatus according to an embodiment of the present invention.

Non-limitative exemplary embodiments of the present invention will now be described with reference to the drawings. In the drawings, the same reference numerals are used for the same or equivalent members or components, and a duplicate description thereof will be omitted.

Figure 2:
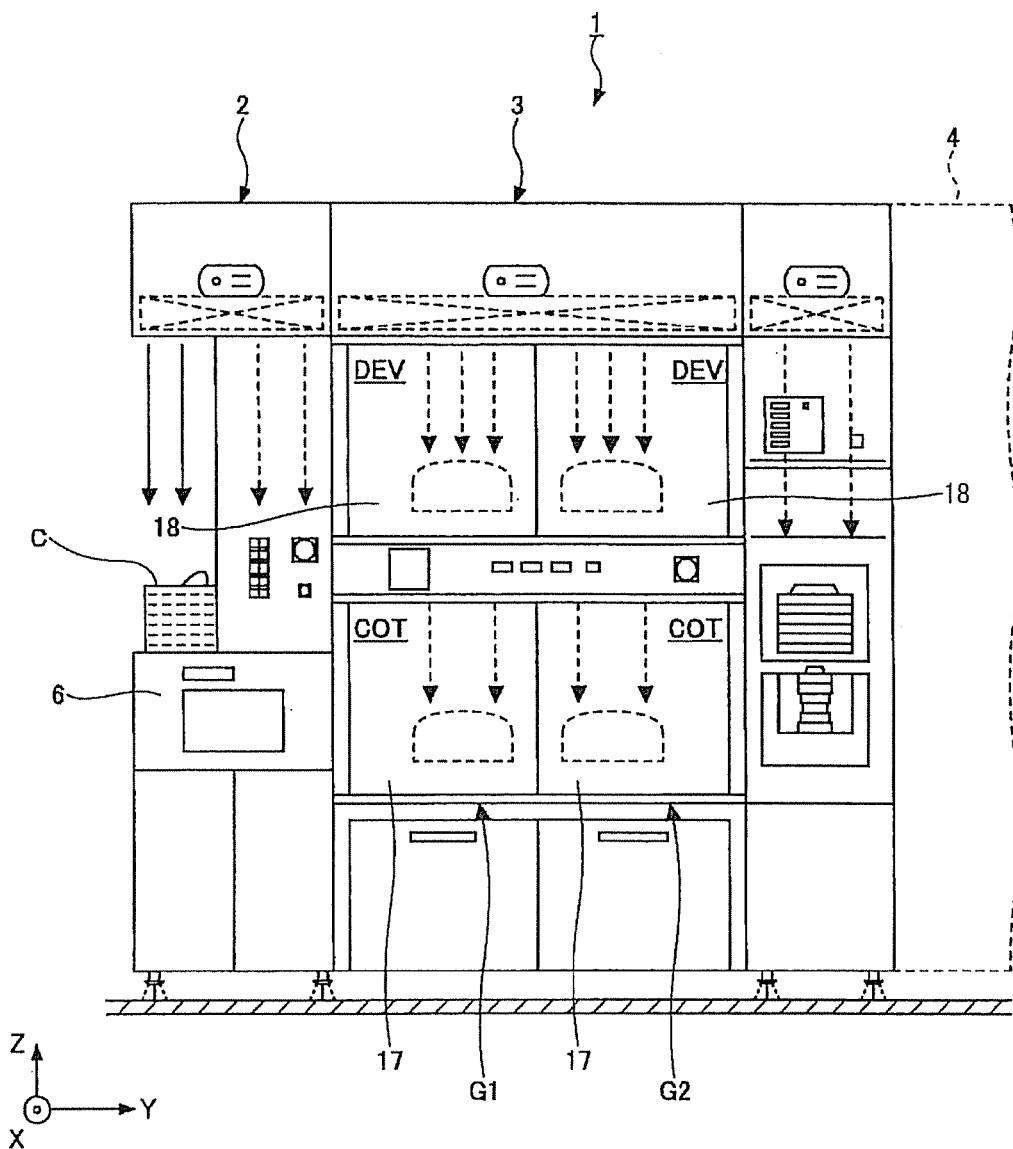
FIG. 2 is a schematic front view of the resist coating/developing apparatus of FIG. 1.
Figure 3:
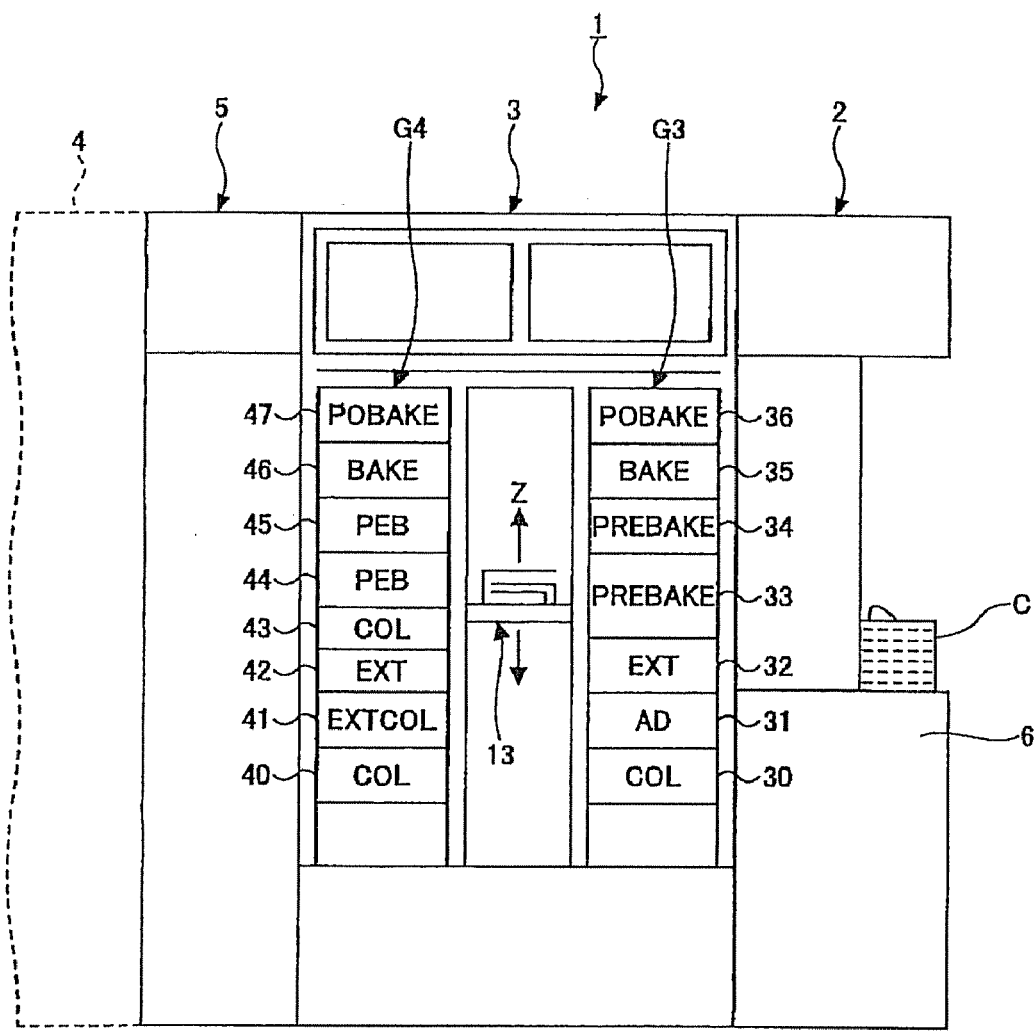
FIG. 3 is a schematic back view of the resist coating/developing apparatus of FIG. 1.

FIG. 1 is a schematic plan view showing the construction of a resist coating/developing apparatus 1 according to an embodiment of the present invention; FIG. 2 is a schematic front view of the resist coating/developing apparatus 1; and FIG. 3 is a schematic back view of the resist coating/developing apparatus 1. As shown in FIG. 1, the resist coating/developing apparatus 1 includes a cassette station 2, a processing station 3 and an interface section 4.

The cassette station 2 includes a stage section 6 on which a cassette C, e.g. housing 25 wafers, is placed, and a wafer transporter 7 for taking a wafer W out of the cassette C placed on the stage section 6, and transferring the wafer W between the cassette C and the processing station 3. A plurality of (e.g. four) cassettes C can be placed on the stage section 6 along the X direction (longitudinal direction of the cassette station 2) of FIG. 1. The wafer transporter 7 is disposed between the stage section 6 of the cassette station 2 and the processing station 3, and can move in the X direction along a transport route 8. The wafer transporter 7 has a wafer transport arm 7a which is movable in the Y direction, Z direction (vertical direction) and θ direction (direction of rotation around Z axis) shown in FIG. 1. The wafer transporter 7 having such construction can selectively reach one of the cassettes C placed on the stage section 6 and sequentially take out wafers W which are housed in multiple stages in the Z direction in the cassette C, and can transport the respective wafers W to the below-described third processing apparatus group G3 of the processing station 3. The wafer transporter 7 preferably has an alignment function of performing alignment of each wafer W.

The processing station 3 includes a main transport apparatus 13 provided generally centrally in the processing station 3, and four processing apparatus groups G1, G2, G3, G4 disposed around the main transport apparatus 13. These processing apparatus groups each have various processing apparatuses disposed in multiple stages, as will be described later. The first processing apparatus group G1 and the second processing apparatus group G2 are disposed on one side of the main transport apparatus 13 in the X direction. The third processing apparatus group G3 and the fourth processing apparatus group G4 are disposed on both sides of the main transport apparatus 13 in the Y direction. In particular, the third processing apparatus group G3 is disposed adjacent to the cassette station 2, and the fourth processing apparatus group G4 is disposed adjacent to the interface section 4.

The main transport apparatus 13 can carry a wafer W into and out of the below-described various processing apparatuses, disposed in the processing apparatus groups G1, G2, G3, G4, and the below-described resist film processing apparatus 60.

As shown in FIG. 2, the first processing apparatus group G1 and the second processing apparatus group G2 each include a resist coating apparatus 17 for applying a resist solution onto a wafer W to form a resist film, and a developing apparatus 18, disposed above the resist coating apparatus 17, for developing the resist film after exposure.

As shown in FIG. 3, the third processing apparatus group G3 includes, in ascending order beginning with the lowest apparatus, a cooling apparatus 30 for cooling the wafer W, an adhesion-enhancing apparatus 31 for carrying out adhesion-enhancing processing to enhance fixing of the resist solution to the wafer W, an extension apparatus 32 for transferring the wafer W, pre-baking apparatuses 33, 34 for carrying out baking to evaporate a solvent from the resist solution on the wafer W, an auxiliary baking apparatus 35, and a post-baking apparatus 36 for carrying out post-baking to heat the developed resist film.

As shown in FIG. 3, the fourth processing apparatus group. G4 includes, in ascending, order beginning with the lowest apparatus, a cooling apparatus 40, an extension/cooling apparatus 41 for naturally cooling the wafer W, an extension apparatus 42 for transferring the wafer W between the main transport apparatus 13 and the below-described wafer transporter 50, a cooling apparatus 43, post-exposure baking apparatuses 44, 45 for heating the resist film after exposure, a preliminary baking apparatus 46, and a post-baking apparatus 47.

The number and the arrangement of such processing apparatus groups, and the number, the types and the arrangement of processing apparatuses provided in each processing apparatus group, may be arbitrarily selected depending on the particular processing carried out in the resist coating/developing apparatus 1, the type of the device to be produced, etc.

Referring again to FIG. 1, a wafer transporter 50 is provided centrally in the interface section 4. The wafer transporter 50 is configured to be movable in the X and Z directions and rotatable in the θ direction. The wafer transporter 50 can transport a wafer W to the extension/cooling apparatus 41 and the extension apparatus 42, both belonging to the fourth processing apparatus group G4, a peripheral exposure apparatus 51 and an exposure apparatus 5.

A resist film processing apparatus 60, disposed in the processing station 3, will now be described by referring to FIGS. 4 through 6.

Figure 4:
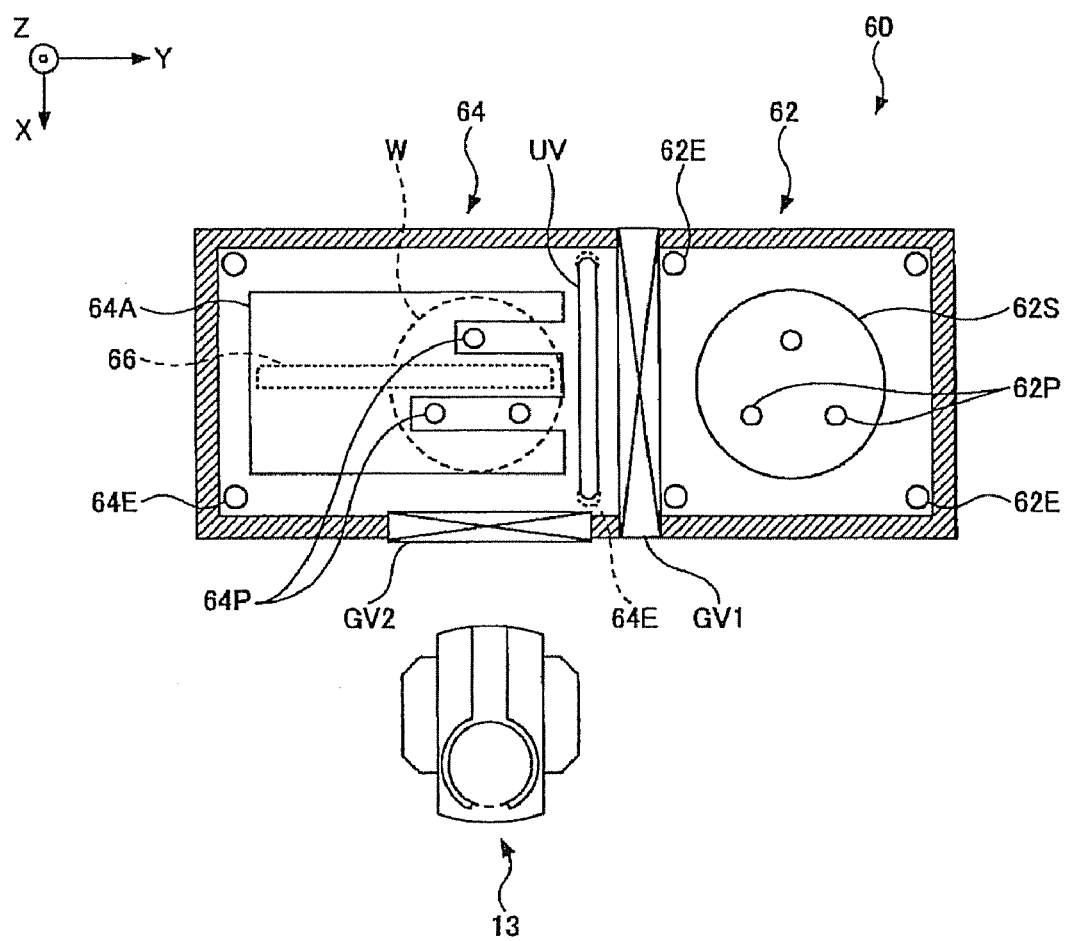
FIG. 4 is a schematic plan view of a resist film processing apparatus included in the resist coating/developing apparatus shown in FIGS. 1 through 3.

Referring to FIG. 4, the resist film processing apparatus 60 includes a processing chamber 62 for carrying out processing of a resist film, and a load lock chamber 64 connected via a gate valve GV1 to the processing chamber 62. In the processing chamber 62 is disposed a susceptor 62S for placing a wafer W on it. The susceptor 62S has three through-holes and three lifting pins 62P which move vertically though the through-holes to place the wafer W on the susceptor 62S and lift it up from the susceptor 62S. The susceptor also has a built-in heating section 62H (FIG. 5) e.g. comprised of a heating wire. To the heating section 62H are connected a power source, a temperature measurement section, a temperature regulator, etc., not shown, so that the susceptor 62S and the wafer W placed on it can be heated at a predetermined temperature. The susceptor 62S preferably also has an electrostatic chuck.

A plurality of (e.g. four as shown in FIG. 4) exhaust ports 62E are formed in the bottom of the processing chamber 62, so that the interior of the processing chamber 62 can be kept at a reduced pressure by means of an exhaust system 70 (shown schematically) connected to the exhaust ports 62E. The exhaust system 70 preferably has a turbo-molecular pump which can achieve a high exhaust velocity. A pressure regulating valve (not shown) is provided in piping connecting the exhaust ports 62 and the exhaust system. The pressure regulating valve, together with a pressure gauge, etc. (not shown) provided in the processing chamber 62, is controlled by a control section (not shown), whereby the pressure in the processing chamber 62 can be adjusted.

The load lock chamber 64 is provided with a transport arm 64A for supporting and transporting a wafer W. The transport arm 64A is movably supported by a guide rail 66 (FIG. 5) and can be reciprocated by means of a not-shown driving device along the guide rail 66 in the Y direction shown in FIG. 5. The transport arm 64A has two slit portions through which three lifting pins 64P can move vertically. By the vertical movement of the lifting pins 64P, the wafer W is placed on the transport arm 64A and lifted up from the transport arm 64A. In this embodiment a conduit for passage of a fluid is provided within the transport arm 64A, and a temperature-controlled fluid can be passed through the conduit by means of a not-shown fluid circulating device. This can cool the wafer W placed on the transport arm 64A. Because the transport arm 64A can make contact with the wafer W in a large area except the slit portions that permit the vertical movement of the lifting pins 64P, the wafer W can be cooled efficiently.

The load lock chamber 64 has a gate valve GV2 that faces the main transport apparatus 13. When the gate valve GV2 is open, the main transport apparatus 13 can carry the wafer W into and out of the load lock chamber 64. When the gate valve GV2 is closed, the load lock chamber 64 can be kept airtight. A plurality of (e.g. four as shown in FIGS. 4 and 5) exhaust ports 64E are formed in the bottom of the load lock chamber 64, so that the interior of the load lock chamber 64 can be kept at a reduced pressure by means of an exhaust system connected to the exhaust ports 64E.

Figure 5:
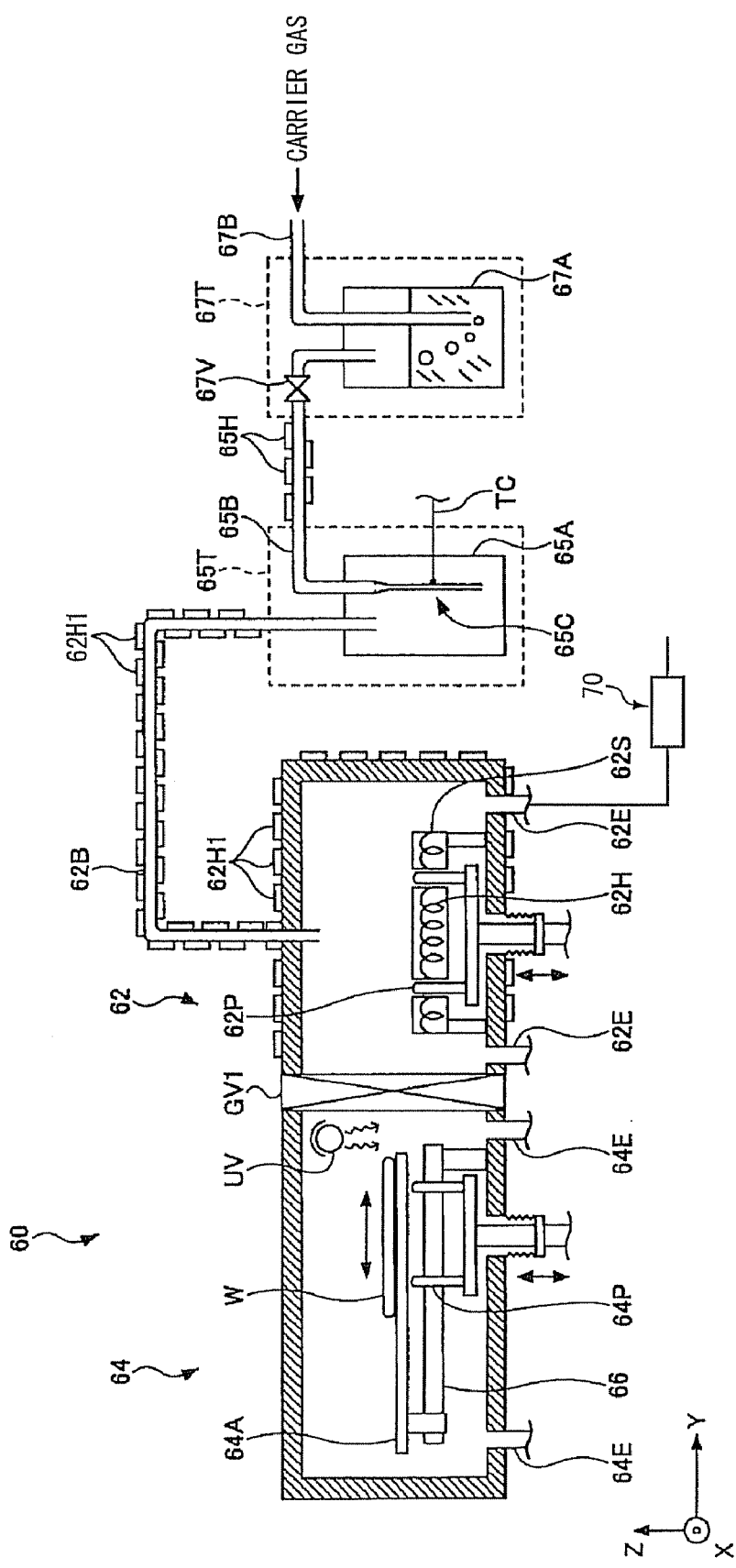
FIG. 5 is a schematic cross-sectional view showing the resist film processing apparatus of FIG. 4, a solvent gas generator and a solvent gas conditioner.

Referring to FIGS. 4 and 5, the load lock chamber 64 is provided with an ultraviolet lamp UV disposed near the ceiling portion and extending along the gate valve GV1. The ultraviolet lamp UV may be a xenon excimer lamp that emits ultraviolet light whose dominant wavelength is 172 nm. By using the ultraviolet lamp UV disposed as shown in the Figures, the wafer W can be irradiated with ultraviolet light when carrying the wafer W from the load lock chamber 64 to the processing chamber 62 (or carrying the wafer W from the processing chamber 62 to the load lock chamber 64) by the transport arm 64A. It is also possible to provide the ultraviolet lamp UV near the ceiling portion of the load lock chamber 64 such that it extends along the gate valve GV2. This makes it possible to irradiate the wafer W with ultraviolet light when carrying the wafer W into or out of the load lock chamber 64 by the main transport apparatus 13. Further, it is also possible to dispose a xenon excimer lamp above the wafer W placed on the transport arm 64A and to irradiate the entire surface of the wafer W with, ultraviolet light by using a mirror, a reflector, or the like.

Referring to FIG. 5, to the resist film processing apparatus 60 is connected a solvent gas generator 67A for generating a solvent gas to be supplied to a resist film on the wafer W, and a solvent gas conditioner 65A for conditioning the solvent gas generated by the solvent gas generator 67A. For convenience of illustration, the solvent gas generator 67A and the solvent vapor conditioner 65A are depicted next to the processing chamber 62 of the resist film processing apparatus 60; however, their location is not limited to such a position. For example, the solvent gas generator 67A and the solvent vapor conditioner 65A may be disposed next to the load lock chamber 64 of the resist film processing apparatus 60, or disposed above the resist film processing apparatus 60. In FIGS. 1 and 4, an illustration of the solvent gas generator 67A and the solvent vapor conditioner 65A is omitted.

As schematically shown in FIG. 5, a bubbler tank is used as the solvent gas generator 67A in this embodiment. In particular, a solvent (liquid) is held in the solvent gas generator 67A. To the solvent gas generator 67A are connected a gas intake pipe 67B for taking in a carried gas that causes bubbling of the solvent, and a bridge pipe 65B for feeding a solvent gas containing the carrier gas and a vapor of the solvent produced by bubbling of the solvent to the solvent gas conditioner 65A. The carrier gas may be an inert gas, such as argon (Ar) gas or helium (He) gas, or nitrogen (N$_2$) gas, and is supplied to the gas intake pipe 67B from a not-shown carrier gas supply source. In another embodiment, a solvent gas may be composed of a vapor of a solvent without including a carrier gas.

In this embodiment the solvent gas generator 67A is housed in a thermostatic container 67T, so that the solvent gas generator 67A, the gas intake pipe 67B and the bridge pipe 65B can be kept at approximately the same temperature. The temperature may be such a temperature as not cause decomposition or denaturation of the solvent, for example, in the range of 80° C. to 120° C., and in particular about 100° C. The temperature of the solvent gas generator 67A is preferably higher than the temperature of the solvent gas conditioner 65A, as will be described later. A tape-shaped heater 65H is wound around the bridge pipe 65B in its portion lying outside the thermostatic container 67T. By heating the bridge pipe 65B with the heater 65H, condensation of the solvent gas in the bridge pipe 65B can be prevented.

The solvent held in the solvent gas generator 67A preferably has the property of dissolving a resist film. Even if the solvent cannot dissolve a resist film, it is sufficient that the solvent has the property of being absorbed into the resist film and swelling the solvent-absorbed portion of the resist film. Such property is herein included in the resist film-dissolving property of the solvent. Specific examples of preferable solvents may include acetone, propylene glycol monomethyl ether acetate (PGMEA), N-methyl-2-pyrrolidinone (NMP), etc.

The gas intake pipe 67B of the solvent gas generator 67A, in its portion lying between the carrier gas supply source (not shown) and the solvent gas generator 67A, is provided with an on-off valve (not shown) for starting/stopping the supply of the carrier gas and a flow controller (not shown) for controlling the flow rate of the carrier gas. The start/stop of the supply of the carried gas and the gas flow rate are controlled by a not-shown control section.

The solvent gas conditioner 65A is comprised of a hollow tank e.g. having a similar size to the bubbler tank. To the solvent gas conditioner 65A is connected the bridge pipe 65B from the solvent gas generator 67A, so that the solvent gas generated by the solvent gas generator 67A can be fed into the solvent gas conditioner 65A. To the solvent gas conditioner 65A is also connected a bridge pipe 62B as a delivery pipe whereby the solvent gas is sent from the solvent gas conditioner 65A to the processing chamber 62. The solvent gas conditioner 65A is housed in a thermostatic container 65T, so that the solvent gas conditioner 65A, the bridge pipe 65B and the bridge pipe 62B can be kept at approximately the same temperature. The temperature may be, for example, in the range of about 70° C. to about 90° C. and preferably about 80° C. Further, the temperature is preferably lower than the temperature of the solvent gas generator 67A.

Figure 6A:
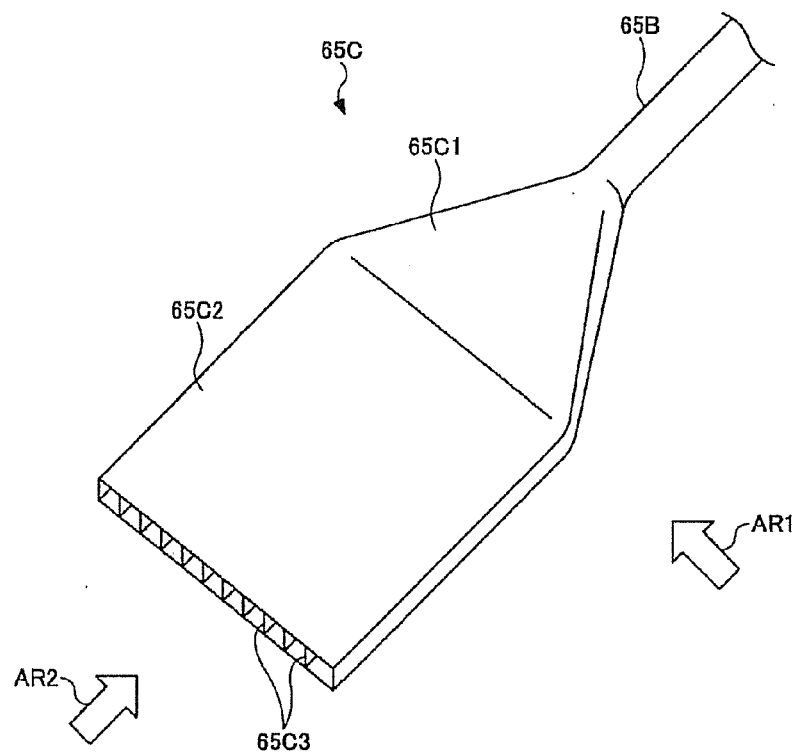
FIG. 6A is a perspective view showing the mist removal nozzle of the solvent gas conditioner shown in FIG. 5.

In the interior of the solvent gas conditioner 65A is provided a mist removal nozzle 65C connected to the bridge pipe 65B from the solvent gas generator 67A. As shown in FIG. 6A, the mist removal nozzle 65C includes a funnel portion 65C1 connected to the bridge pipe 65B, and a flat rectangular conduit portion 65C2 connected to the funnel portion 65C1.

The funnel portion 65C1 is comprised of two plate-like members having a generally triangular shape, and is connected to the bridge pipe 65B at the apex of the triangle and to the rectangular conduit portion 65C2 in the base of the triangle. The funnel portion 65C1 is sealed in the side walls of the two plate-like members, and has a flat funnel-like shape as a whole.

Figure 6B:
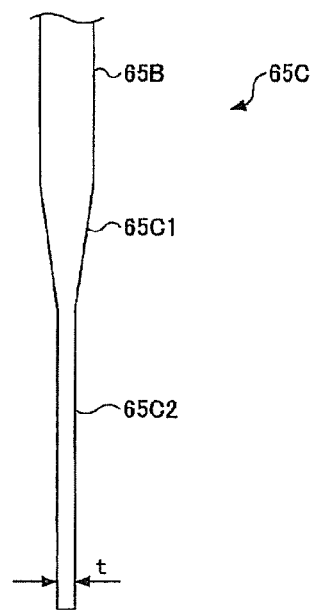
FIG. 6B is a side view of the mist removal nozzle of FIG. 6A as viewed in the direction of arrow AR1 shown in FIG. 6A.

FIG. 6B is a side view of the mist removal nozzle 65C as viewed in the direction of arrow AR1 shown in FIG. 6A. As shown in the Figure, the thickness of the funnel portion 65C1 gradually decreases from the bridge pipe 65B side, having the maximum thickness equal to the outside diameter of the bridge pipe 65B, to the rectangular conduit portion 65C2 side, having the minimum thickness equal to the thickness of the flat rectangular conduit portion 65C2. The flow passage of the solvent gas is thus converted from the flow passage having a circular cross-section in the bridge pipe 65B into the flow passage having a rectangular cross-section in the rectangular conduit portion 65C2.

Figure 6C:
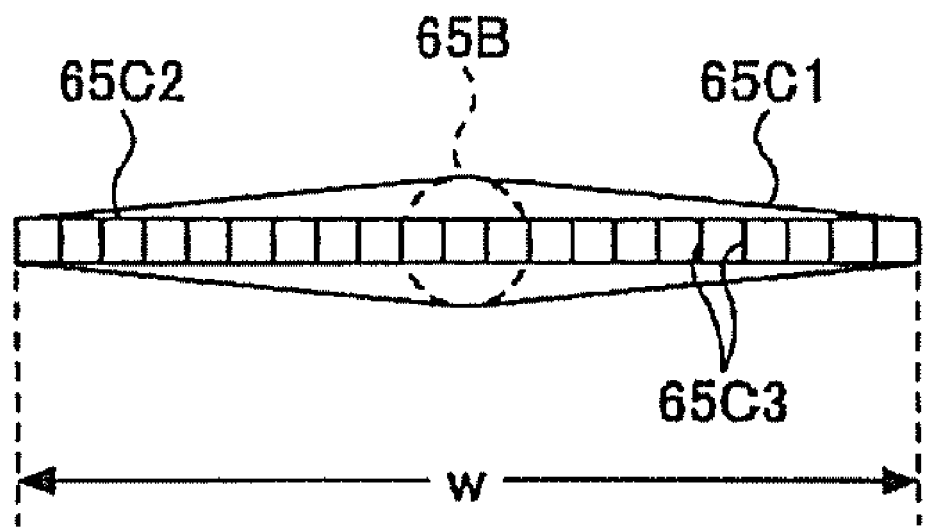
FIG. 6C is a side view of the mist removal nozzle of FIG. 6A as viewed in the direction of arrow AR2 shown in FIG. 6A.

The rectangular conduit portion 65C2 is open at the end connecting to the funnel portion 65C1 and at the opposite end so that the solvent gas, fed through the bridge pipe 65B, is ejected into the solvent gas conditioner 65A. As shown in FIGS. 6A and 6C (side view of the mist removal nozzle 65C as viewed in the direction of arrow AR2 shown in FIG. 6A), in the interior of the rectangular conduit portion 65C2 are provided a number of partition walls 65C3 extending in the gas flow direction in which the solvent gas flows from the funnel portion 65C1 to the rectangular conduit portion 65C2. The partition walls 65C3 can increase the surface area of the interior surface of the rectangular conduit portion 65C2. As shown in FIG. 5, the rectangular conduit portion 65C2 is provided with a thermocouple TC so that the temperature of the rectangular conduit portion 65C2 (mist removal nozzle 65C) can be controlled.

According to the solvent gas conditioner 65A thus constructed, if a mist or minute droplets are contained in the solvent gas supplied from the solvent gas generator 67A to the solvent gas conditioner 65A, the mist or minute droplets are adsorbed mainly onto the interior surface of the rectangular conduit portion 65C2 when the solvent gas collides against the interior surface. The mist or the like can thus be securely removed from the solvent gas. The solvent gas conditioner 65A having the mist removal nozzle 65C may be most preferably used when using, as the solvent gas generator 67A, a sprayer or ultrasonic atomizer which directly sprays the solvent in the form of a mist.

Because the solvent gas conditioner 65A is housed in the thermostatic container 65T and, in addition, the rectangular conduit portion 65C2 is provided with the thermocouple TC, the solvent gas conditioner 65A can be kept at a lower temperature than the solvent gas generator 67A. Accordingly, the temperature of the solvent gas, passing through the solvent gas conditioner 65A, can be made lower than that in the solvent gas generator 67A. Therefore, if the solvent gas is not fully saturated e.g. due to high flow rate of the carrier gas, the degree of saturation of the solvent gas (the concentration of the solvent vapor in the carrier gas) can be increased (to supersaturation) by passing the solvent gas through the solvent gas conditioner 65A.

Referring again to FIG. 5, the bridge pipe 62B from the solvent gas conditioner 65A is connected to the ceiling portion of the processing chamber 62. The outlet opening of the bridge pipe 62B connected to the processing chamber 62 is located above approximately the center of the susceptor 62S, so that the solvent gas can be supplied to the entire surface of the wafer W placed on the susceptor 62S.

As shown in FIG. 5, a tape-shaped heater 62H1 is wound around the processing chamber 62 and a tape-shaped heater 62H2 is wound around the bridge pipe 62B, so that the temperature of the processing chamber 62 and the temperature of the bridge pipe 62B can be controlled. The temperatures may be, for example, in the range of about 70° C. to about 90° C. and is preferably equal to the temperature of the solvent gas conditioner 65A. Such temperature control can prevent the solvent gas from condensing onto the interior surfaces of the bridge pipe 62B and the processing chamber 62.

The operation of the resist coating/developing apparatus 1 provided with the resist film processing apparatus 60 (process to be carried out in the resist coating/developing apparatus 1) according to the present invention will now be described.

First, an unprocessed wafer W is taken out of the cassette C by the wafer transporter 7 (FIG. 1), and the wafer W is transported to the extension apparatus 32 (FIG. 3) of the third processing apparatus group G3. The wafer W is then carried by the main transport apparatus 13 into the adhesion-enhancing apparatus 31 of the third processing apparatus group G3, where hexamethyldisilazane (HMDS), for example, is applied to the wafer W in order to enhance the adhesion of a resist solution to the wafer W. The wafer W is then transported to the cleaning apparatus 30, where the wafer W is cooled to a predetermined temperature. Thereafter, the wafer W is transported to the resist coating apparatus 17, where a resist solution is applied onto the rotating wafer W to form a resist film.

The wafer W having the resist film is transported by the main transport apparatus 13 to the pre-baking apparatus 33, where pre-baking of the resist film is carried out. The wafer W is then transported by the main transport apparatus 13 to the extension/cooling apparatus 41, where the wafer W is cooled. Thereafter, the wafer W is transported by the wafer transporter 50 to the peripheral exposure apparatus 51 and then to the exposure apparatus 5. The substrate W is subjected to predetermined processing in the respective apparatuses. After carrying out exposure of the resist film using a photomask in the exposure apparatus 5, the wafer W is transported by the wafer transporter 50 to the extension apparatus 42 of the fourth processing apparatus group G4.

Thereafter, the wafer W is transported by the main transport apparatus 13 to the post-exposure baking apparatus 44, where post-exposure baking of the exposed resist film is carried out. The wafer W is then transported to the cooling apparatus 43, where the wafer W is cooled. The wafer W is then transported by the main transport apparatus 13 to the developing apparatus 18 of the first processing apparatus group G1 or the second processing apparatus group G2, where development of the exposed resist film is carried out. A patterned resist film (resist mask) is thus formed on the wafer W.

The wafer W after the development is transported by the main transport apparatus 13 to the resist film processing apparatus 60 (FIGS. 4 and 5). Specifically, after setting the internal pressure of the load lock chamber 64 of the resist film processing apparatus 60 at atmospheric pressure, the gate valve GV2 (FIG. 4) is opened and the wafer W is carried by the main transport apparatus 13 into the load lock chamber 64 and held above the three lifting pins 64P. The lifting pins 64P then move upward and receive the wafer W from the main transport apparatus 13. After the main transport apparatus 13 exits the load lock chamber 64, the lifting pins 64P move downward to place the wafer W on the transport arm 64A. After closing the gate valve GV2, the load lock chamber 64 is evacuated and kept at a predetermined internal pressure. The pressure in the load lock chamber 64 may be, for example, in the range of about 7 Torr (0.933 kPa) to about 10 Torr (1.33 kPa).

The wafer W is then carried from the load lock chamber 64 to the processing chamber 62. In particular, the gate valve GV1 between the load lock chamber 64 and the processing chamber 62 is opened, and the transport arm 64A moves along the guide rail 66 to carry the wafer W to the processing chamber 62 and hold the wafer W above the susceptor 62S. Preferably, the ultraviolet lamp UV provided in the load lock chamber 64 is lit to irradiate the wafer W with ultraviolet light during transportation of the wafer W to the processing chamber 62. The ultraviolet light irradiation is preferred especially when the resist film is an ArF resist having low solubility in a solvent. This is because lactone, contained in the ArF resist, will be decomposed by the ultraviolet light irradiation.

The lifting pins. 62P then move upward and receive the wafer W from the transport arm 64A. After the transport arm 64A exits the processing chamber 62, the lifting pins 62P move downward to place the wafer W on the susceptor 62S. Thereafter, the gate valve GV1 is closed, and the processing chamber 62 is evacuated through the exhaust ports 62E by means of the exhaust system (not shown) to keep the processing chamber 62 at a predetermined internal pressure. Preferably, the pressure is lower than the below-described pressure during processing of the resist film and is such a pressure as not to considerably lower the throughput due to the time taken for the evacuation, for example, about 0.1 Torr (13.3 Pa) to about 7 Torr (0.933 kPa).

Thereafter, the resist film of the wafer W is subjected to processing to flatten the patterned resist film, carried out in the following manner: First, the valve 67V is opened to supply the carrier gas from the not-shown carrier gas supply source to the gas intake pipe 67B of the solvent gas generator 67A. The carrier gas is ejected from the gas intake pipe 67B into the solvent held in the solvent gas generator 67A. The carrier gas, while flowing in the solvent, takes in a vapor of the solvent and is supplied, as a solvent gas, through the bridge pipe 65B to the solvent gas conditioner 65A.

The solvent gas from the bridge pipe 656 is ejected through the mist removal nozzle 65C into the solvent gas conditioner 65A. Especially when the solvent gas passes through the mist removal nozzle 65C, a mist or the like, contained in the solvent gas, is removed through collision of the solvent gas against the interior surface. Because the temperature of the solvent gas conditioner 65A is lower than the temperature of the solvent gas generator 67A, the solvent gas having a high temperature, generated by the solvent gas generator 67A, is cooled by the solvent gas conditioner 65A (especially by the mist removal nozzle 65C). Thus, the solvent gas (carrier gas containing a vapor or gas of the solvent), containing no mist or the like and having a high degree of saturation, is supplied through the bridge pipe 62B to the processing chamber 62 of the resist film processing apparatus 60.

When the solvent gas is supplied to the processing chamber 62, the processing chamber 62 becomes filled with the solvent gas at a predetermined pressure and the resist film on the wafer W becomes exposed to the solvent gas. The pressure in the processing chamber 62 may be lower than atmospheric pressure, and preferably in the range of about 1 Torr (0.133 kPa) to about 10 Torr (1.33 kPa). Such a pressure enables the resist film on the wafer W to be moderately exposed to the solvent gas.

After exposing the resist film to the solvent gas for a predetermined period of time, the valve 67V is closed and the supply of the carrier gas is stopped to terminate the resist film processing for the wafer W. After the resist film processing, the susceptor 62S and the wafer W placed on it are heated with the heating section 62H embedded in the susceptor 62. The heating temperature may be, for example, in the range of about 70° C. to about 130° C.

Figure 7:
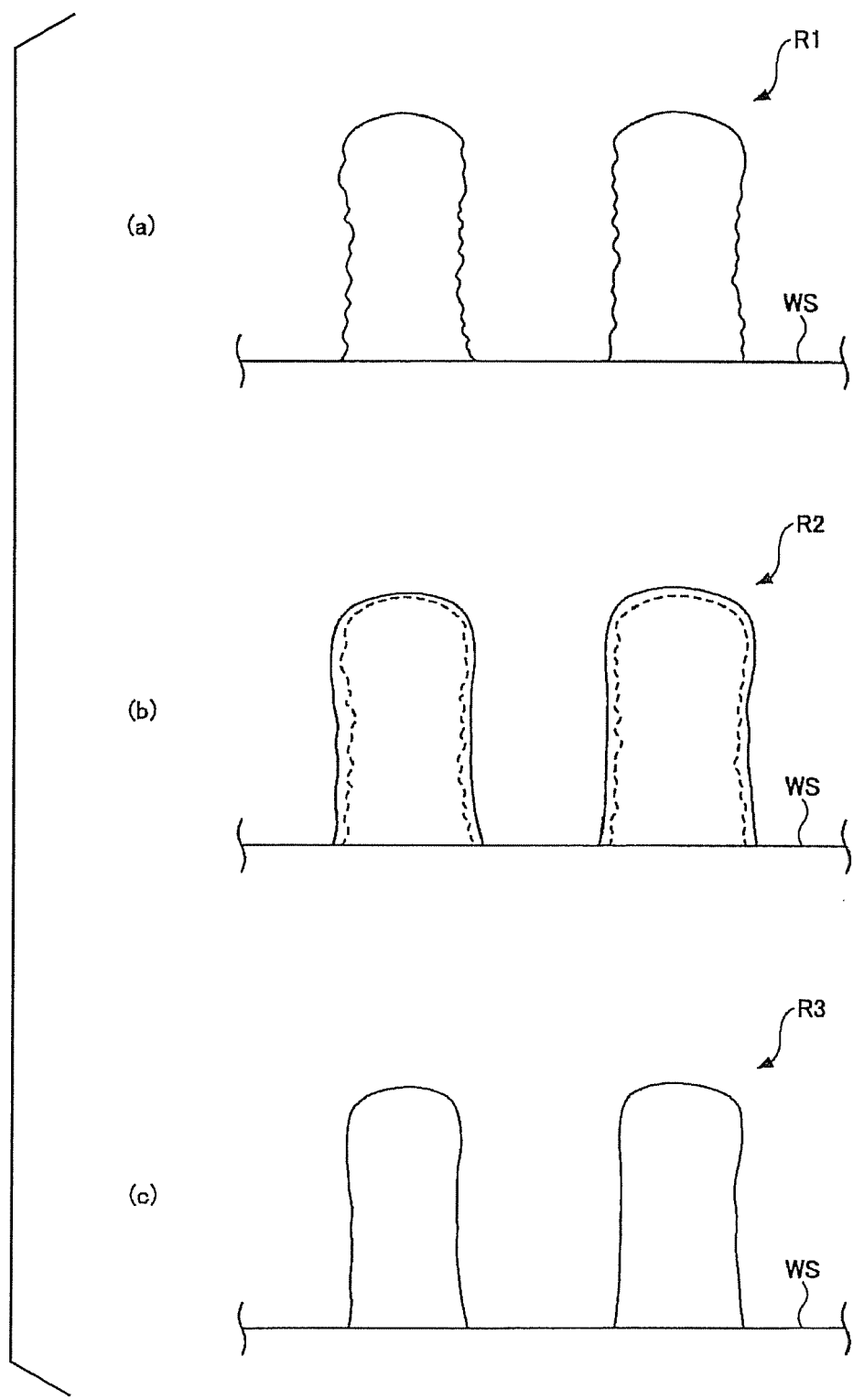
FIG. 7 is a diagram illustrating the effect of the resist film processing apparatus shown in FIG. 4.

The mechanism of flattening of the resist film by the above processing will now be described. FIG. 7(a) is a diagram schematically showing a cross section of a "line" of a resist film having a line and space pattern. As shown in the Figure, the resist film R1 after development has surface irregularities especially in the side surfaces. Such irregularities are considered to be produced e.g. by interference of exposing light in the resist film during exposure. When the resist film is exposed to a solvent gas, the solvent is adsorbed onto the surface (upper surface and side surfaces) of the resist film. The adsorbed solvent dissolves the resist film and/or is absorbed into the resist film, thereby swelling the resist film as shown in FIG. 7(b). The surface portion of the swollen resist film R2 is liquefied and the surface is flattened by the surface tension. When the solvent is evaporated by the subsequent heating, the swollen portion of the resist film contracts, whereby the resist film is further flattened. A resist film R3, having a flattened surface as shown in FIG. 7(c), can thus be obtained. The heating of the resist film R2 also has the effect of preventing lowering of the etching resistance of the resist film.

After completion of the flattening processing, the wafer W is carried from the processing chamber 62 to the load lock chamber 64 according to the inverse procedure to the above-described procedure for carrying the wafer W from the load lock chamber 64 to the processing chamber 62. Upon the transportation, the wafer W is cooled quickly by the transport arm 64A of the load lock chamber 64.

The wafer W is then carried by the main transport apparatus 13 out of the load lock chamber 64 and transported to the post-baking apparatus 47 of the fourth processing apparatus group G4, where post-baking of the resist film is carried out. The wafer W is then transported by the main transport apparatus 13 to the cooling apparatus 40 of the fourth processing apparatus group G4, where the wafer W is cooled. Thereafter, the wafer W is returned via the extension apparatus 32 to the original cassette C, thereby completing the sequence of process steps including the resist coating, exposure and development.

As described hereinabove, according to the resist coating/developing apparatus 1 of this embodiment, a resist film which has been patterned by development is exposed to a solvent gas under reduced pressure in the resist film processing apparatus 60 and the solvent, adsorbed onto the resist film, dissolves and swells the surface of the resist film, thereby flattening surface irregularities of the resist film. This can reduce the line width roughness (LWR) of the resist pattern. It therefore becomes possible to reduce variation in the threshold voltage of a field-effect transistor (FET) even when the gate of the FET is formed with a small critical dimension, such as 32 nm or 22 nm.

Because the solvent gas is supplied into the processing chamber 62 which is kept at a reduced pressure, and is discharged by means of the exhaust system, the solvent gas will not diffuse out of the resist processing apparatus 60. Further, the solvent gas generator 67A holding the solvent is hermetically closed, and the gas intake pipe 67B and the bridge pipe 65B are hermetically connected to the solvent gas generator 67A. Therefore, there is no possibility of a vapor of the solvent diffusing in the interior space of the resist coating/developing apparatus 1. Accordingly, a wafer W will not be exposed to the solvent in the interior space of the resist coating/developing apparatus 1. This can prevent the lowering of the resist film-developing effect caused by the solvent.

In this embodiment the solvent and the solvent gas are confined to a limited region. Accordingly, even when a flammable solvent is used, there is no fear of ignition of the solvent gas caused by an ignition source which may be a device in the resist coating/developing apparatus 1 or a device in a clean room.

The resist film processing apparatus 60 of this embodiment is provided with the solvent gas conditioner 65A which performs conditioning of the solvent gas, such as removal of a mist or the like from the solvent gas generated in the solvent gas generator 67A and increase of the solvent saturation of the solvent gas. If a solvent gas containing a mist or the like is supplied to the processing chamber 62 and the mist or the like adheres to a patterned resist film, the resist film can be dissolved excessively in the surface portion, resulting in deformation of the resist pattern. According to this embodiment, a mist or the like is removed from the solvent gas by the solvent gas conditioner 65A having the mist removal nozzle 65C. This enables uniform swelling of a resist film and flattening of the film surface. Further, by bringing the solvent gas to supersaturation by means of the solvent gas conditioner 65A, a vapor or gas of the solvent can be supplied at a high concentration to the processing chamber 62. This can promote flattening of a resist film. Further, the use of a supersaturated solvent gas can improve the reproducibility of the solvent concentration, leading to improved process reproducibility.

While the present invention has been described with reference to the embodiments thereof, it will be understood by those skilled in the art that the present invention is not limited to the particular embodiments disclosed, but it is intended to cover modifications within the scope of the present invention as defined by the appended claims.

For example, in the processing chamber 62 of the resist film processing apparatus 60, it is possible to divide the front end of the bridge pipe 62B into a plurality of branches or to attach a shower head to the front end in order to supply the solvent gas uniformly to a wafer W. It is also possible to design the susceptor 62 to be movable in a horizontal direction, and to supply the solvent gas to a wafer W while moving the wafer W placed on the susceptor 62S.

Figure 8:
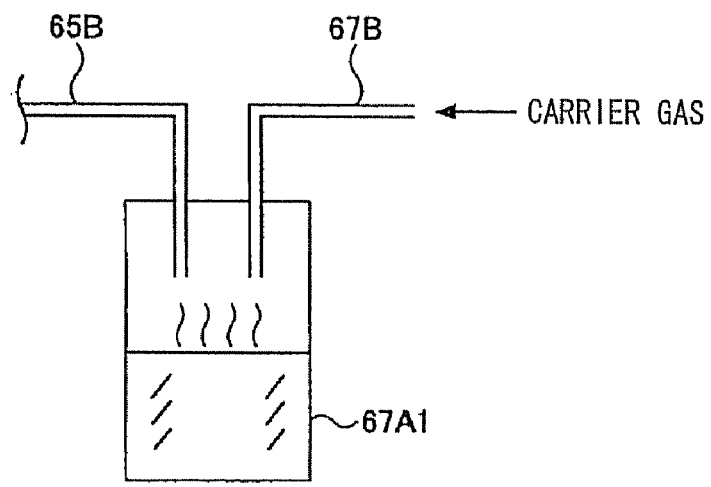
FIG. 8 is a diagram showing a variation of the solvent gas generator shown in FIG. 5.

Instead of the bubbler tank shown in FIG. 5 or the above-described sprayer or ultrasonic atomizer as a solvent gas generator, it is possible to use a vapor supply device as shown in FIG. 8. In the solvent gas generator 67A1 of FIG. 8, unlike the bubbler tank, the gas intake pipe 67B does not reach into the solvent. Thus, the carrier gas, supplied to the solvent gas generator 67A1, takes in a vapor of the solvent that fills the space over the solvent and is sent through the bridge pipe 65B.

Figure 9:
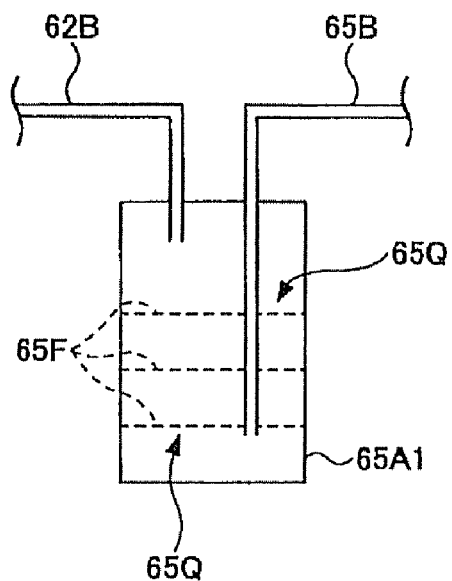
FIG. 9 is a diagram showing a variation of the solvent gas conditioner shown in FIG. 5.

Instead of the mist removal nozzle 65C, it is possible to use a plurality of baffle plates 65F as shown in FIG. 9 in a solvent gas conditioner. In the embodiment shown in FIG. 9, the solvent gas ejected from the front end of the bridge pipe 65B into the solvent gas conditioner 65A1 flows upward while passing through the openings 65Q of the lowest baffle plate 65F. The openings 65Q of the second-stage baffle plate 65F are not in alignment with the openings 65Q of the lowest baffle plate 65F in the vertical direction. Accordingly, the solvent gas collides against the lower surface of the second-stage baffle plate 65F and changes the flow direction, and then passes through the openings 65Q and flows upward. Upon the collision of the solvent gas against the lower surface of the second-stage baffle plate 65F, a mist or the like contained in the solvent gas is adsorbed onto the lower surface. The mist or the like can thus be removed from the solvent gas. Instead of the use of the three baffle plates 65F, two or four or more baffle plates 65F may of course be used. It is, of course, possible to provide a thermocouple in any of the baffle plates 65F in order to perform temperature adjustment.

The baking after exposure of a patterned resist film to the solvent gas may be carried out not by means of the susceptor 62S in the processing chamber 62, but by means of e.g. the baking apparatus 46 or the post-baking apparatus 47 of the fourth processing apparatus group G4. That is, it is possible to carry out only post-baking without carrying out baking in the processing chamber 62. Further, instead of the provision of the heating section 62H in the susceptor 62S, it is possible to provide a heating lamp in the ceiling portion of the load lock chamber 64 and carry out baking with the heating lamp The above-described exemplary temperatures of the solvent gas generator 67A and the solvent gas conditioner 65A may of course be changed depending on the type of the solvent used, the concentration of the solvent in the solvent gas, etc. The generator 67A and the conditioner 65A may be set at such temperatures as not to cause thermal denaturing or decomposition of the solvent and to avoid condensation of the solvent gas e.g. in the bridge pipes 65B, 62B.

The irradiation of a resist film, especially an ArF resist film, with ultraviolet light may not necessarily be performed with the ultraviolet light UV disposed in the load lock chamber 64 of the resist film processing apparatus 60. For example, it is possible to provide a processing apparatus for ultraviolet irradiation in the fourth processing apparatus group G4, and perform ultraviolet irradiation of a resist film in the processing apparatus.

Though a semiconductor wafer has been described as a substrate on which a resist film is to be formed, it is also possible to use a substrate for a flat panel display (FPD). Thus, the resist coating/developing apparatus and method of the present invention may be used for the production of an FPD.

What is claimed is:

1. A resist coating and developing apparatus comprising:
    a resist film-forming unit that applies a resist onto a substrate to form thereon a resist film;
    a resist developing unit that develops the resist film after exposure;
    a solvent gas generating unit that is set to a predetermined temperature and that generates a gaseous body containing a vapor of a solvent having a property of dissolving the resist film;
    a solvent gas conditioning unit that is set to a temperature lower than the predetermined temperature and conditions of the gaseous body generated in the solvent gas generating unit, the solvent gas conditioning including an inflow pipe allowing the gaseous body generated by the gas generating unit to flow into the solvent gas conditioning unit, and further including a nozzle connected to the inflow pipe;
    a processing chamber that is set to a temperature lower than the predetermined temperature, and that can be maintained at a reduced pressure, and that houses the substrate having thereon the resist film which has been developed and patterned in the resist developing unit;
    a heating unit, disposed in a processing chamber, that allows the substrate to be placed thereon and heats the substrate;
    a supply unit that supplies the gaseous body, having been conditioned by the solvent gas conditioning unit, toward the substrate placed on the heating unit;
    an exhaust unit that evacuates the processing chamber to a reduced pressure; and
    a temperature control unit that raises temperature of the heating unit after the gaseous body is supplied to the substrate placed on the heating unit.

2. The resist coating and developing apparatus according to claim 1, wherein the nozzle is composed of:
    a conversion member that converts an inner cross sectional shape of the inflow pipe; and
    a conduit member connected to the conversion member and configured to allow multiple collision of the gaseous body inflown from the conversion member with inner surfaces of the conduit member so as to remove the mist contained in the gaseous body.

3. The resist coating and developing apparatus according to claim 2 further comprising an ultraviolet light source that irradiates the developed and patterned resist film with ultraviolet light before supplying the gaseous body toward the substrate.

4. The resist coating and developing apparatus according to claim 1 further comprising an ultraviolet light source that irradiates the developed and patterned resist film with ultraviolet light before supplying the gaseous body toward the substrate.

5. The resist coating and developing apparatus according to claim 1, wherein the solvent is acetone, propylene glycol monomethyl ether acetate (PGMEA) or N-methyl-2- pyrrolidinone (NMP), or a combination of two or more of them.

6. A resist coating and developing method comprising:
    applying a resist onto a substrate to form a resist film;
    exposing the resist film using a predetermined photomask;
    developing and patterning the exposed resist film;
    placing the substrate having the patterned resist film on the heating unit, for placement of the substrate thereon to heat the substrate, disposed in a processing chamber that can be maintained at a reduced pressure;

decompressing the processing chamber;

generating a gaseous body containing a vapor or a gas of a solvent having a property of dissolving the resist film, by means of a solvent gas generating unit which is set to a predetermined temperature;

conditioning the gaseous body generated by the solvent gas generating unit, by means of a solvent gas conditioning unit which is set to a temperature lower than the predetermined temperature;

supplying the conditioned gaseous body toward the substrate which is placed on the heating unit housed in the processing chamber, which is set to a temperature lower than the predetermined temperature; and raising a temperature of the heating unit after the supplying toward the substrate.

7. The resist coating and developing method according to claim 6 further comprising:

irradiating the developed and patterned resist film with ultraviolet light, before supplying the gaseous body to the substrate.

8. The resist coating and developing method according to claim 6, wherein the solvent is acetone, propylene glycol monomethyl ether acetate (PGMEA) or N-methyl-2-pyrrolidinone (NMP), or a combination of two or more of them.

* * * * *